(12) United States Patent
Duraffourg et al.

(10) Patent No.: US 9,382,108 B2
(45) Date of Patent: Jul. 5, 2016

(54) NANOWIRE SENSOR DEVICE

(75) Inventors: Laurent Duraffourg, Voiron (FR);
Philippe Andreucci, Moirans (FR);
Thomas Ernst, Morette (FR); Sebastien Hentz, Grenoble (FR)

(73) Assignee: COMMISSARIAT A L'ENERGIE ATOMIQUE, Paris (FR)

( * ) Notice: Subject to any disclaimer, the term of this patent is extended or adjusted under 35 U.S.C. 154(b) by 239 days.

(21) Appl. No.: 12/713,909

(22) Filed: Feb. 26, 2010

(65) Prior Publication Data
US 2010/0219489 A1 Sep. 2, 2010

(30) Foreign Application Priority Data

Feb. 27, 2009 (FR) ...................................... 09 51251

(51) Int. Cl.
*H01L 29/76* (2006.01)
*B81B 3/00* (2006.01)

(52) U.S. Cl.
CPC ....... *B81B 3/0086* (2013.01); *B81B 2201/0214* (2013.01); *B81B 2203/0109* (2013.01)

(58) Field of Classification Search
CPC ............... B81B 2201/0214; B81B 2203/0109; B81B 3/0086
USPC ............ 257/9, 14, 24, 213, E27.006, E29.07, 257/E21.404; 977/720, 724, 755, 762, 810, 977/813–816, 830, 837, 936–938, 953; 310/319, 323.06, 339, 367; 73/1.48, 73/23.4, 31.05
See application file for complete search history.

(56) References Cited

U.S. PATENT DOCUMENTS 7,051,945 B2 * 5/2006 Empedocles et al. ......... 235/492
2006/0081886 A1 * 4/2006 Mostarshed et al. .......... 257/213
2008/0149919 A1   6/2008 Ernst et al.

FOREIGN PATENT DOCUMENTS

FR           2 884 648 A1   10/2006
WO    WO 2005/106417 A2   11/2005

OTHER PUBLICATIONS

U.S. Appl. No. 12/740,907, filed Apr. 30, 2010, Thomas, et al.
Rongrui He, et al., "Self-Transducing Silicon Nanowire Electromechanical Systems at Room Temperature", Nano Letters, vol. 8, No. 6, 2008, pp. 1756-1761.
I. Bargatin, et al., "Sensitive detection of nanomechanical motion using piezoresistive signal downmixing", Applied Physics Letters 86, 133109, 2005, 3 pages.
J. L. Arlett, et al., "BioNEMS: Nanomechanical Systems for Single-Molecule Biophysics", Nobel Symposium 131, 2006, pp. 1-34.
K. Jensen, et al., "An atomic-resolution nanomechanical mass sensor", Nature nanotechnology, vol. 3, Letters, Sep. 2008, pp. 533-537.
Noboru Yamazoe, "Toward innovations of gas sensor technology", Elsevier, Sensors and Actuators B 108, 2005, pp. 2-14.

(Continued)

*Primary Examiner* — Meiya Li
(74) *Attorney, Agent, or Firm* — Oblon, McClelland, Maier & Neustadt, L.L.P.

(57) ABSTRACT

A device including: a nanowire that includes a first conductive region, and a second region, wherein the second region is an insulator material, the second region does not occupy an entire thickness of the nanowire, and the nanowire is configured so that a current is able to circulate in the nanowire from one end of the nanowire to another end of the nanowire.

21 Claims, 18 Drawing Sheets

(56) References Cited

OTHER PUBLICATIONS

Jay W. Grate, et al., "Hybrid Organic/Inorganic Copolymers with Strongly Hydrogen-Bond Acidic Properties for Acoustic Wave and Optical Sensors", Chem. Mater, 9, 1997, pp. 1201-1207.

Iona Voiculescu, et al., "Electrostatically Actuated Resonant Microcantilever Beam in CMOS Technology for the Detection of Chemical Weapons", IEEE Sensors Journal, vol. 5, No. 4. Aug. 4, 2005, pp. 641-647.

B. Ilic, et al., "Mechanical resonant immunospecific biological detector", Applied Physics Letters, vol. 77, No. 3, Jul. 17, 2000, pp. 450-452.

B. Ilic, et al., "Virus detection using nanoelectromechanical devices", Applied Physics Letters, vol. 85, No. 13, Sep. 27, 2004, pp. 2604-2606.

A. N. Cleland, et al., "External control of dissipation in a nanometer-scale radiofrequency mechanical resonator", Sensors and Actuators 72, Elsevier, 1999, pp. 256-261.

K. L. Ekinci, et al., "Ultrasensitive nanoelectromechanical mass detection", Applied Physics Letters, vol. 84, No. 22, May 31, 2004, pp. 4469-4471.

Vera Sazonova, et al., "A tunable carbon nanotube electromechanical oscillator", Nature, vol. 431, Sep. 16, 2004, pp. 284-287.

Julien Arcamone, et al., "A Compact and Low-Power CMOS Circuit for Fully Integrated NEMS Resonators". IEEE Transactions on Circuits and Systems—II: Express Briefs, vol. 54, No. 5, May 2007, pp. 377-381.

Chengyin Wang, et al., "Ultrasensitive biochemical sensors based on microcantilevers of atomic force microscope", Analytical Biochemistry 363, 2007, pp. 1-11.

R. Lefevre. et al., "Scaling Law in Carbon Nanotube Electromechanical Devices", Physical Review Letters 95, Oct. 28, 2005. pp. 185504-1-185504-4.

U.S. Appl. No. 14/619,656, filed Feb. 11, 2015, Ruellan, et al.

\* cited by examiner

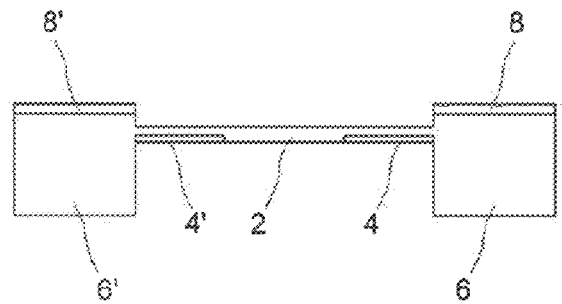
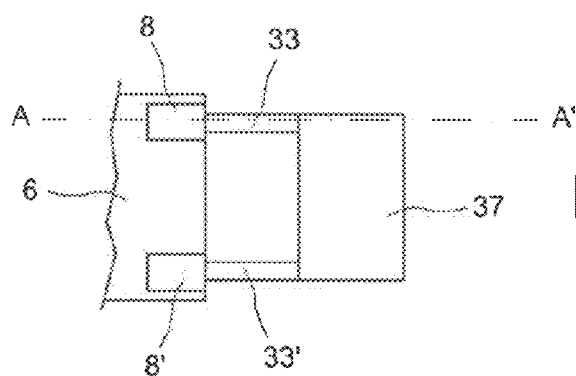
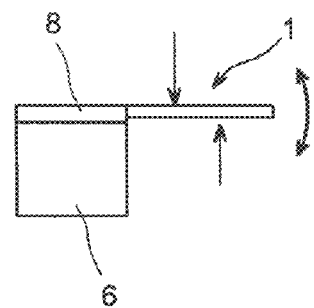

NANOWIRE SENSOR DEVICE

TECHNICAL AREA AND PRIOR ART

The invention concerns the fabrication and use of sensors containing nanowires. It finds applications in varied areas, such as the area of chemical sensors notably gas phase or liquid phase, or the area of force sensors notably inertial or molecular, or further the area of mass spectrometry.

A nanowire has a very small diameter (less than <100 nm), a very favourable surface/volume ratio and is therefore sensitive to any external perturbation, for example by modulation of its electric conductance when atoms are adsorbed on its surface. Nanowires are therefore candidates for ultimate mass measurement with expected accuracies close to a dalton ($1.67 \times 10^{-24}$ g).

When they are used as vibrating mechanical elements, their sensitivity—defined as the ratio of the frequency shift induced by added mass (e.g. by adsorption) to their own mass—is high since the latter (own mass) is very low (1.7 ag for a wire of length 1 µm and diameter of 30 nm).

A sensor structure is also known from document WO 2005/106417 which uses a nanobeam, and another nanowire device is known from the description in the article by M. Roukes et al., Nanoletters, Vol 8, no 6, p. 1756-1761 (2008). The nanowire is set in vibration by an external pieozelectric vibrating potentiometer, then by electrostatic excitation. The nanowire is excited to beyond its critical amplitude, which allows stresses to be generated in the nanowire thereby permitting use of the second-order piezoresistive effect. The nanowire is constructed by growth between two silicon pads.

In the device described in this article, the nanowire is both the piezoresistive transducer (the current passes through the wire) and the proof mass (the motion of its own mass induces inertia).

The observed piezoresistive effect is the variation in resistance of the nanowire in relation to its own flexural motion.

However, in this type of system, the piezoresistive effect obtained is of second-order. This is also the case for the sensor structure described in document WO2005/106417. This limits the sensitivity of the sensor and complicates processing of the electric signal which corresponds to twice the frequency of excitation. It is effectively shown that the relative variation in its resistance $\Delta R/R$ is proportional to the square of its deflection:

$$\frac{\Delta R}{R} = G\frac{\Delta L}{L} = G\varepsilon_L = G\frac{\pi^2}{4}\left(\frac{a}{L}\right)^2 \quad (1)$$

where G is the gauge factor characterizing the piezoresistive phenomenon. G depends on material, on the crystalline orientation and cross-section of the wire. L is the length of the wire shown in FIG. 1. $\Delta L$ is its variation in length. $\varepsilon_L$ is the associated strain.

DISCLOSURE OF THE INVENTION

A sensor device according to the invention, of nanowire type, comprises at least one nanowire, having a first, conductive, region and a second region in insulator material, this second region not occupying the entire thickness of the nanowire. An electric current is able to circulate in the nanowire from one of its ends to the other.

The second region can extend over a shorter length than the nanowire.

According to one embodiment, the conductive part of the nanowire is in doped semiconductor material, for example in piezoresistive material or in metal material.

A device according to the invention allows use of a first-order piezoresistive effect i.e. a variation in resistance of the wire, when it is subjected to axial strain, proportional to elongation of the wire. Axial strain is proportional to movement in the direction of bending of the nanowire, which corresponds to flexural motion.

The conductive part of the nanowire can be in doped semiconductor material such as doped Si. The semiconductor can be doped with arsenic for example, or boron, or phosphorus.

The conductive part of the nanowire can be in a silicided metal (Si in which metal has been diffused), for example in NiSi or WSi or PtSi.

The insulator material can be in a dielectric material or an intrinsic semiconductor material, for example in silicon or an alloy of silicon and germanium (SiGe), non-doped.

The dielectric region is in silicon or aluminium nitride for example, or in silicon oxide.

As a variant, a device according to this embodiment comprises:
 a dielectric region in non-doped SiGe and a conductive region in doped Si,
 or a dielectric region in non-doped Si, and a conductive region in doped SiGe.

If the silicon is doped, it is piezoresistive and has a high gauge factor G, for example around 1,000, whereas if the silicon is silicided it becomes metallic and its G factor is very low, for example about 2.

One end of the nanowire can be attached to a fixed anchor region, this anchor region further comprising an electric contact region. Optionally each of the two ends are attached in this way.

At least one electric contact region can be made in the same conductive material as the first, conductive, region of the nanowire. One or more contact regions can be made in semiconductor material doped to a greater or lesser extent to impart conductive properties, for example with doping of between $10^{15}$ cm$^{-3}$ and $10^{19}$ cm$^{-3}$, or even greater than $10^{19}$ cm$^{-3}$, or equal to or more than $10^{20}$ cm$^{-3}$ (the semiconductor material can therefore be degenerate on account of this heavy doping). For doping arsenic may be used for example, or preferably boron or phosphorus optionally with a gradient in the thickness. A device according to the invention therefore provides an improvement for taps or contact or access regions, and hence very low access resistance.

As a variant, a mobile mass can be fixed to one of the ends of the nanowire. There may be at least two nanowires, both attached to the mobile mass. The other end of each nanowire can be attached to a common anchor region that is fixed.

A device according to the invention can further comprise transduction means, translating into an electric signal the movement of at least one nanowire or of a mass attached to one of the ends of the nanowire.

Means to actuate a nanowire according to the invention can be provided, for example of electrostatic type or thermoelastic type or further of magnetic type.

BRIEF DESCRIPTION OF THE DRAWINGS

FIG. 1 is a schematic view of a wire bending by an amplitude a,

FIGS. 11A and 11B show a metal nanowire according to the invention, with an insulating layer close to the anchor points, FIGS. 12A and 12B show a device comprising two nanowires according to the invention, arranged to form two flexural arms attached to a mass vibrating outside its plane.

DETAILED DESCRIPTION OF EMBODIMENTS OF THE INVENTION

Figure 1:
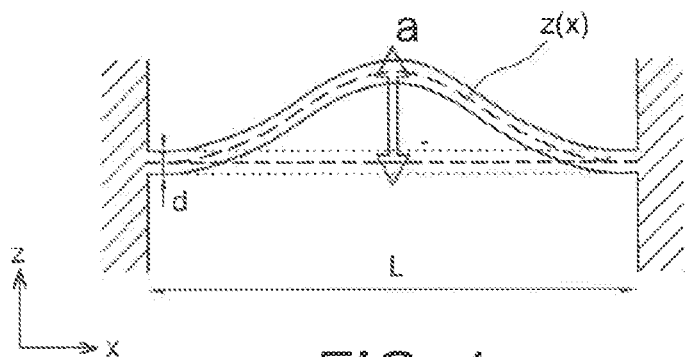
Figure 2:
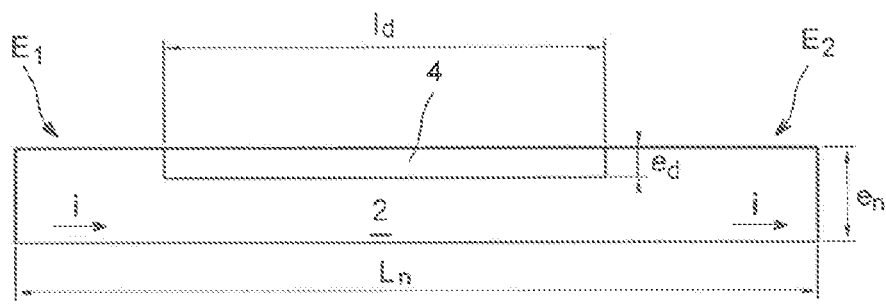
FIG. 2 shows a nanowire according to the invention.

A structure of a device according to the invention is illustrated in FIG. 2. This structure comprises a nanowire 1 which itself comprises two parts or regions 2, 4 having very different conductivities.

Two types of conductive region 2, and hence two types of transductions, can be used. These two embodiments will be successively described.

In a first embodiment of the invention, one of these regions, here region 2 is piezoresistive and conductive, whilst region 4 is insulating or dielectric. This first type of device according to the invention therefore uses the piezoresistivity intrinsic in a nanowire consisting of doped semiconductor material for example. The gauge factor G (longitudinal) is then high, in the order of 1,000 or over.

The conductive region 2 is made in a semiconductor material for example, such as silicon (but other semiconductors can be used) which can be more or less doped so as to impart conductive properties.

Doping can be more or less extensive, for example between $10^{15}$ cm$^{-3}$ and $10^{19}$ cm$^{-3}$. For doping arsenic can be used for example, or preferably boron or phosphorus, optionally with a gradient in the thickness. Said doping can be performed during epitaxy of a layer of semiconductor material in which the nanowire is to be fabricated. As a variant, other techniques are possible such as implantation for example.

The insulating region 4 can be in a nitride e.g. SiN or an oxide e.g. $SiO_2$. Advantageously, the insulating layer is in AlN. As a variant, there may be a plurality of simple dielectric layers.

As a variant, one layer can be gradually modified, for example with a doping gradient in the thickness by single implantation or a succession of implantation steps. This gradient can be obtained for example by implantation followed by annealing. Implantation can also be performed using successive implantation steps at different penetration depths.

These examples of dielectric materials and of conductive piezoresistive materials can be used in the various examples given below of the first embodiment of the invention.

In another embodiment, one of these regions, here region 2, is metallic whilst region 4 is insulating or dielectric. This promotes so-called "piezoresistive" transduction due to elongation of the metal with low gauge factor (longitudinal). Metallic nanowires are much less resistive than those in semiconductor material. The associated Johnson noise is therefore lower and allows smaller resolutions to be obtained than in the first embodiment. On the other hand, the sensitivity (response slope) is lower than in the piezoresistive case obtained with a semiconductor.

A nanowire in this second embodiment can be fabricated for example from a wire in a silicide such as NiSi, WSi2 or PtSi. It is optionally possible to dope by implantation until amorphisation of a nanowire in semiconductor material, or to perform doping during epitaxy of a layer in which the nanowire is to be formed (this solution allows the generation of a doping gradient).

One insulating material for region 4 of this second embodiment is intrinsic silicon for example, or an insulator such as SiN or $SiO_2$.

Here again, these examples of dielectric materials and conductive, piezoresistive materials can be used in the various examples given below of the second embodiment of the invention.

Irrespective of the envisaged embodiment, a device according to the invention uses the circulation of a current i over the entire length of the nanowire. However, the resistance of the conductive portion varies in relation to its strain. The nanowire is therefore used both as proof mass (it forms the mobile part) and as gauge element (it is its electric properties which are measured). In particular it is possible to measure the variation in current i in the nanowire, this wire being under constant tension, when this nanowire is subjected to strain.

In FIG. 2, it is also possible to see the geometric characteristics of a nanowire according to the invention. The total length of the nanowire is designated $L_n$ and its thickness or its diameter by $e_n$, whilst the length and the thickness (or diameter) of the dielectric region 4 are respectively designated $l_d$ and $e_d$.

The thickness or diameter $e_n$ is less than 50 nm, or less than a few tens of nm, it can be 40 nm for example. In a nanowire of the invention, the following condition C1 is at least met: $e_d < e_n$. In other words, the dielectric region does not occupy the entire thickness of the nanowire, and a current i is able to circulate therein from one of its ends $E_1$ to the other end $E_2$. For example $e_d$ is equal to 10 nm. For an optimal effect, an insulator thickness of 40 nm is considered and a thickness of doped Si of 10 nm, or more generally an insulator thickness that is greater than the thickness of the doped Si; or according to another example, a Si thickness of 40 nm is considered and a metal thickness of 10 nm, or more generally a Si thickness that is greater than the metal thickness.

If there are several dielectric regions 4 along the wire, each observes condition C1. In some embodiments, there is also the following condition C2: $l_d < L_n$, which means that the dielectric region 4 does not have a longitudinal extension along the entire length $L_n$ of the nanowire.

Region 4, insulating or dielectric, can therefore be localized in the nanowire. This localization particularly allows minimisation of the global resistance of the wire, to optimize the signal-to-noise ratio: for a given insulator material, the dimensions $l_d$ and $e_d$ of region 4 can be selected to adapt the résistance of the wire.

Figure 3:
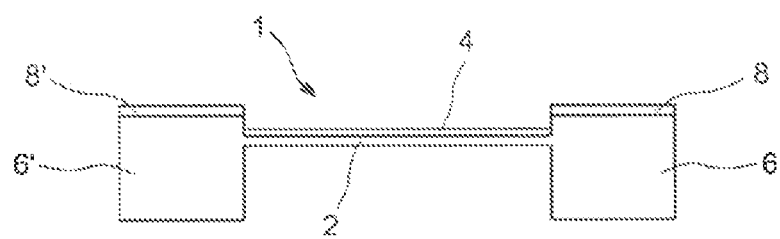
FIG. 3, and FIGS. 4A-8B, show various nanowire structures according to the invention.

FIG. 3 shows a device according to the invention of the first type mentioned above, with a piezoresistive conductive region. Other examples of this embodiment are described with reference to FIGS. 4A-9B.

In the example in FIG. 3, this nanowire 1 meets the first of the two above geometric conditions: the dielectric region 4 extends along the entire length of the nanowire, but in a limited thickness thereof. The nanowire is suspended between two pads or support regions or clamping regions 6,6'. An electric contact 8,8' is provided on each of these pads. In this example of embodiment, as in the others, these pads are made on a doped semiconductor region for example, then silicided and finally metallized. In this figure, as in the others, means may be added to apply an operating electric voltage between the two ends of the wire, and means to measure the variation in current in the wire due to a stress applied to the wire. These means are not shown in the figures.

Figure 4A:
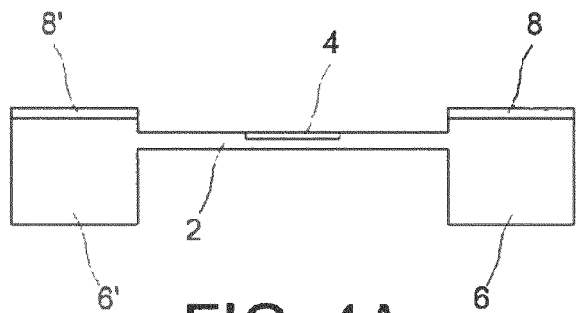
Figure 4B:
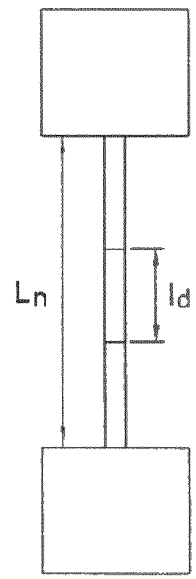

FIGS. 4A and 4B show a nanowire 1 in silicon having a dielectric layer 4 in its centre, which this time is localized. References 8 and 8' again designate electric contacts. In this example the two above conditions C1 and C2 are met: the dielectric region 4 extends over only one part of the length of the nanowire, and in only one thickness thereof.

Figure 5A:
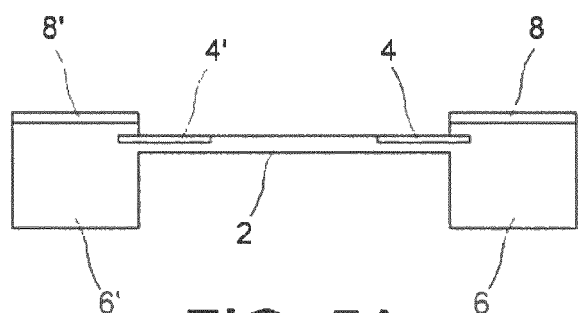
Figure 5B:
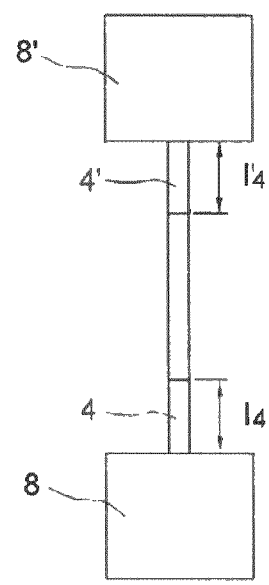

The variant in FIGS. 5A and 5B shows a device in which an insulator layer 4, 4' is placed in the vicinity of each clamping 6, 6' of the nanowire. The total length of the insulator layers is less than the length of the nanowire (condition C2 above), the thickness of each one is also less than the thickness of the nanowire (condition C1). The electric contacts are again designated 8, 8'.

This variant is more advantageous than the preceding one since the stresses applied to the wire are maximal at its ends, close to the clamping regions 6, 6'. The electric signal is therefore all the stronger in this type of structure.

Figure 6A:
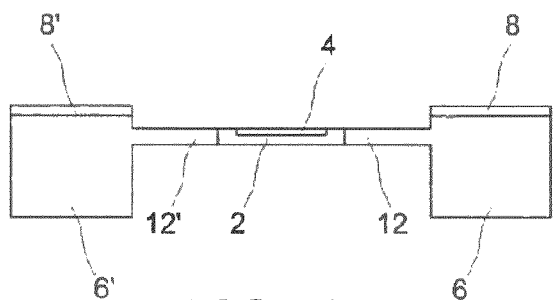
Figure 6B:
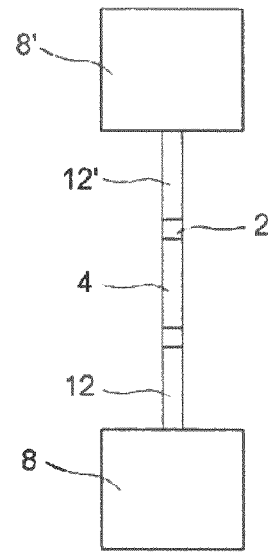
Figure 7A:
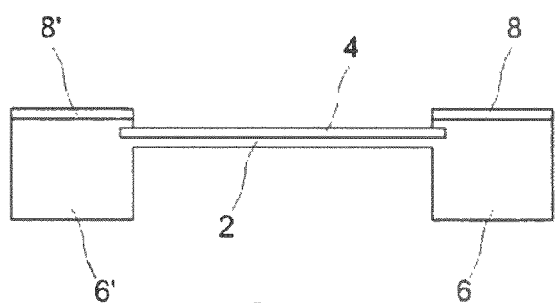
Figure 7B:
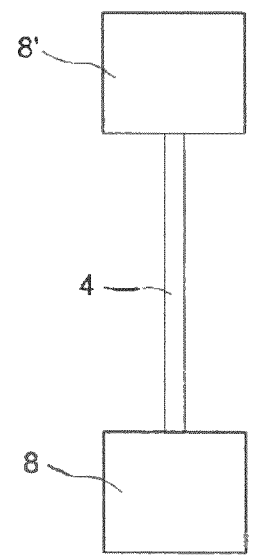
Figure 8A:
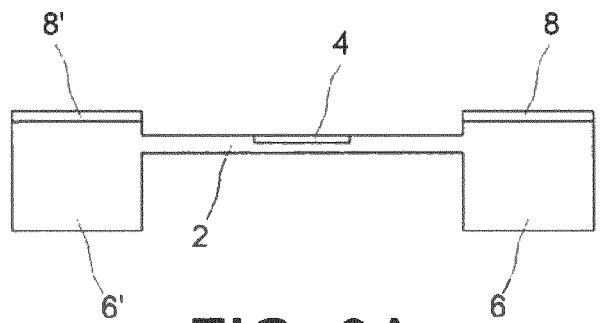
Figure 8B:
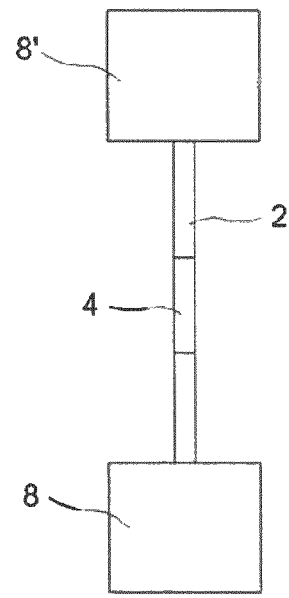

To reduce the value of the resistance of the contacts 6, 6', it is possible to silicide and/or dope the anchor points and optionally those nanowire regions close to the anchor points which then contribute towards the contacts. It is also possible to alternate the layers. Therefore the following are shown:

in FIGS. 6A, 6B, a nanowire 1 in silicon having a dielectric layer 4 in its centre, which meets the two above conditions C1 and C2. It can be seen in this example that the nanowire comprises a central portion 2 in piezoresistive material and a dielectric region 4. The side portions 12, 12' of the wire are made in a silicide for example such as NiSi; they form continuations of each of the conductive regions 8, 8'. In other words, they overstep each pad to form part of the nanowire 1. With this configuration it is possible to improve ohmic contacts considerably between the ends of the wire and each of the conductive regions 8, 8'; more generally, as already indicated, one or more contact regions can be made in semiconductor material doped to a greater or lesser extent to impart conductive properties, e.g. with doping of between $10^{15}$ $cm^{-3}$ and $10^{19}$ $cm^{-3}$ or even greater than $10^{19}$ $cm^{-3}$ or equal to or greater than $10^{20}$ $cm^{-3}$ (the semiconductor can therefore be degenerate on account of this heavy doping). For doping, arsenic may be used for example or preferably boron, or phosphorus optionally with a gradient in the thickness. A device of the invention therefore provides improved taps or contact or access regions, and hence very low access resistance;

in FIGS. 7A, 7B, a nanowire in silicon 2 doped with a layer 4 of non-doped SiGe, with insulating behaviour since having very high resistivity (the case with non-doped [intrinsic] SiGe of high resistivity, or "HR" SiGe). Said layer 4 in SiGe can be obtained by epitaxy for example. The length of this layer 4 is identical to the length of the nanowire, but its thickness is narrower than that of the nanowire, conforming to above condition C1, and in FIGS. 8A, 8B, a nanowire in silicon 2 (or other doped semiconductor material) with a layer 4 in SiGe that is non-doped and localized (in the centre of the nanowire for example). Said layer 4 in SiGe can be obtained by epitaxy for example. This time, this layer 4 has a shorter length than the length of the nanowire, conforming with above-indicated condition C2, and its thickness is narrower than that of the nanowire, conforming to above-indicated condition C1.

Regarding FIGS. 7A, 7B, 8A-8B, the functions of the two layers, respectively in Si and in SiGe, can be reversed. It is possible to dope SiGe to make it conductive, and not to dope the silicon so that it can be used as dielectric material (it is "HR" Si).

Figure 9A:
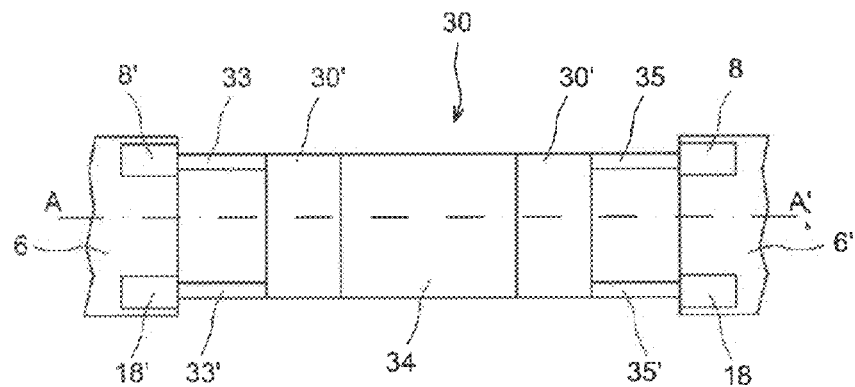
FIGS. 9A to 9C show a device comprising several nanowires according to the invention, arranged around a mass vibrating outside its plane.
Figure 9B:
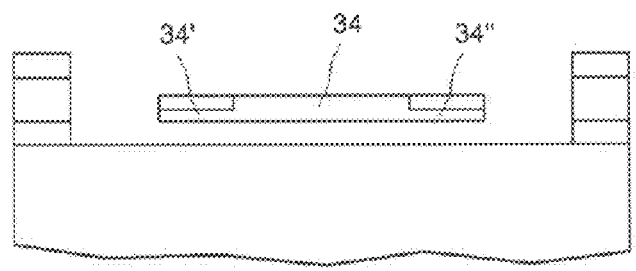
Figure 9C:
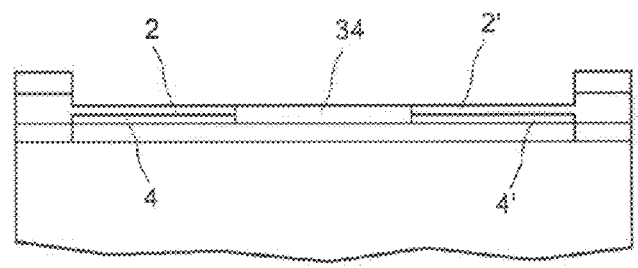

A nanowire structure according to the invention, as shown in FIGS. 5A-9B, can be used in a more complex structure comprising a mass such as the one shown in FIGS. 9A-9C.

FIGS. 9B and 9C are cross-sectional views along planes AA' and BB' of FIG. 9A.

This structure comprises a mass 30, disposed at a central part, vibrating outside its plane. In this example, from an overhead view, it is of substantially rectangular shape connected to each of the two clamping regions 6, 6' by nanowires 33, 33', 35, 35'.

Other shapes from an overhead view are possible, for example circular or elliptical, here again with nanowires.

Each arm effectively consists of a nanowire according to the present invention. One end of each nanowire is connected to the fixed part 6, 6' of the device via conductive regions 8, 8', 18, 18', as in the preceding examples.

The mass 30 itself contains a dielectric portion 34, over the entire thickness of the mass, and which separates the device into two parts 30', 30", each of these parts forming a measurement region with the two nanowires 33, 33' and 35, 35' connected to it. The remainder of the mass 30 is in conductive material. It can be seen in FIG. 9C that, in the central part, the dielectric portion 34 is extended by dielectric regions 34', 34" of narrower thickness than region 34, these possibly being arranged in the continuity of the dielectric regions 4, 4' of the nanowires. In FIG. 9C the structure can be seen of each of the two nanowires 33',35' shown in FIG. 9A: each of these two nanowires comprises a dielectric layer 4, 4' and a conductive layer 2,2'.

More generally, one or more nanowires can be associated or connected to one or more masses e.g. in an array. This makes it possible to increase the capture surface for mass measurement applications or to increase inertial mass for inertial force sensors.

In a nanowire according to the invention, internal strains may appear due to differences in the mesh parameters of the conductor 2 and dielectric 4, and due to the difference in thermal expansion coefficients of each of these materials. These strains can be controlled in order to obtain nanowires in tension. This control can be achieved for example by controlling the deposit temperature(s) and by controlling the relative thicknesses of different layers. A nanowire according to the invention can therefore provide higher rigidity and a higher resonance frequency than a nanowire made solely in silicon. This generally applies to any device according to the invention.

The second type of device according to the invention uses a metallic material 2, preferably with low gauge factor G (about 2).

Figure 10A:
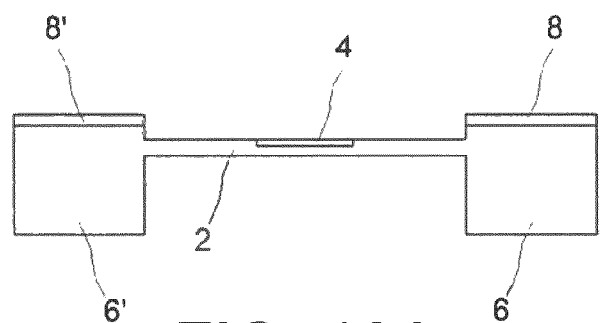
FIGS. 10A and 10B show a metal nanowire of the invention, with an insulating region in its centre.
Figure 10B:
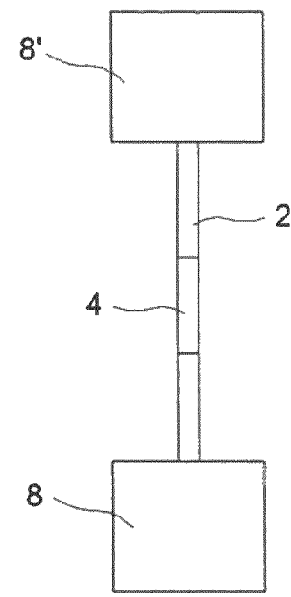

FIGS. 10A and 10B illustrate a metallic nanowire whose centre 4 is in insulator material e.g. intrinsic silicon, or in an insulator such as SiN. In this example, the two above conditions C1 and C2 are met: the dielectric region extends over only part of the length of the nanowire, and in only part of its thickness.

The variant in FIGS. 11A and 11B shows a device in which the nanowire is partly insulating in its thickness, by nitriding in a region 4, 4' close to the clamping regions 6, 6'. The electric contacts are again designated 8, 8'.

The structure of a device according to the invention may be more complex. It can have the shape of the one which would be obtained according to FIGS. 9A-9C by replacing every reference to a piezoresistive part by a metallic part. The mass 30 against acts as vibrating mass.

Other structures using a device with dissymmetric nanowire according to the invention can be obtained, irrespective to which above embodiment such nanowires may conform.

This is the case for example for the structure in FIGS. 12A-12B, with two nanowires anchored in a pad 6, the other end of each nanowire being connected to a mass 37. This mass 37 allows a current loop to be obtained. It is therefore at least partly conductive. The remainder of the mass is generally, through construction, within the materials of the nanowire since fabricated at the same time as the wire. With each nanowire a contact region 8,8' is associated in the pad 6. The assembly is U-shaped as shown in FIG. 12A.

It is possible to place the above-described devices of the invention in an array.

Said array may be in variable forms, with variable pitch or fixed pitch, as will be explained with reference to FIGS. 13 to 15.

In each of these figures, a device comprises a plurality of nanowires 1, 21, 31, . . . according to the invention, arranged parallel to each other, each of the two ends of the each nanowire being connected to a pad 60, 60' or to part of a substrate. The current circulating in the wires enters via the pad 60 and emerges via pad 60'.

Each of these devices comprises at least one control electrode 22, 22' parallel to the nanowires.

Figure 13:
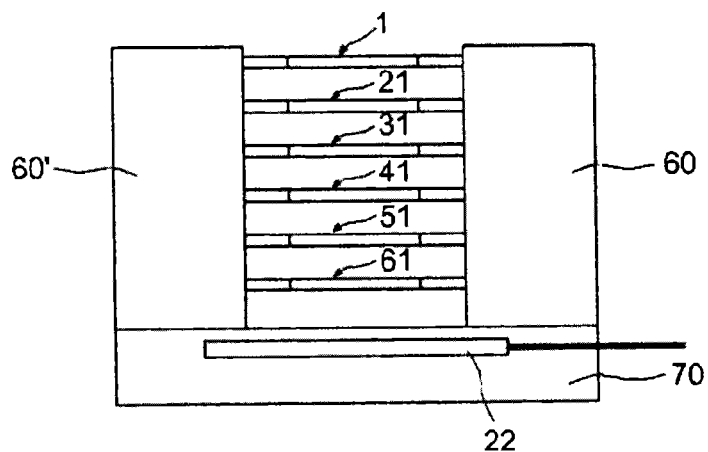
FIGS. 13-15 show devices with arrays of nanowires according to the invention.

The array shown in FIG. 13 is of vertical type i.e. perpendicular to the plane of a carrier wafer or substrate 70.

Figure 14:
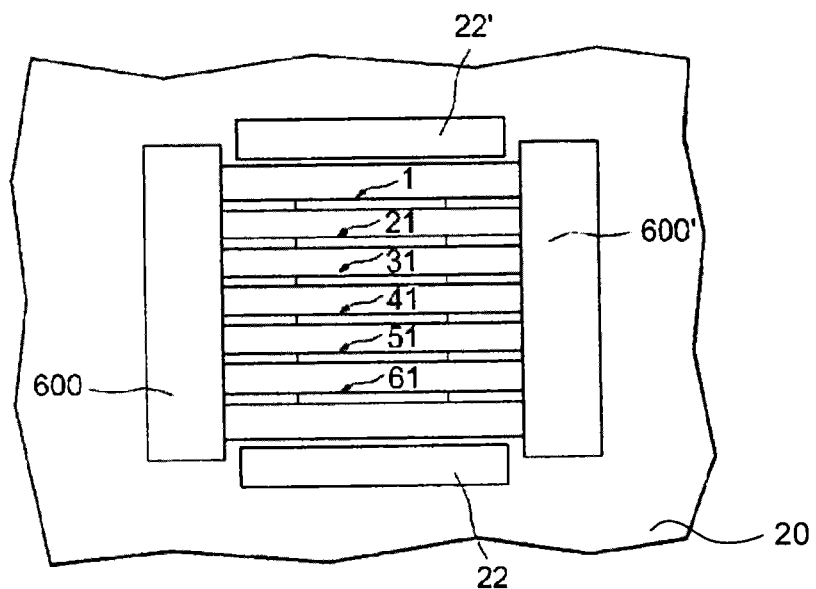
Figure 15:
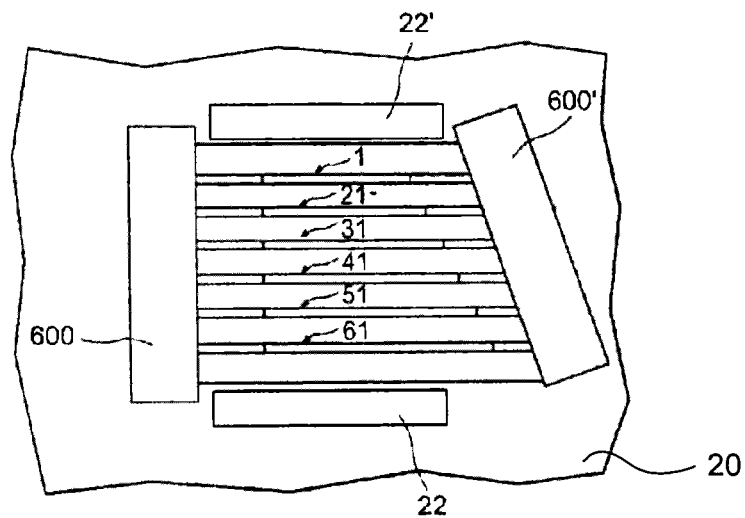

The array illustrated in FIGS. 14 and 15 is of horizontal type i.e. the nanowires form a two-dimensional array lying in the plane of a wafer or substrate 20, and in which they may have been formed. References 22, 22' designate two control electrodes, arranged either side of the array of nanowires and parallel thereto. The current circulating in the wires enters via region 600 and emerges via region 600'.

In the variant of array shown in FIG. 15, the nanowires are of increasing length in a direction perpendicular to the nanowires. Therefore, each nanowire can be addressed individually, since each thereof has a frequency different to the other nanowires. Each nanowire is able to detect different chemical species via selective functionalization. Each species will correspond to a given frequency.

Means to actuate a nanowire of the invention comprise means of electrostatic type for example. As a variant, the actuation means may comprise means of thermoelastic type, or of magnetic type or any other means. Said means are used to impart motion to the nanowire, in a direction perpendicular to its direction of extension.

Electrostatic actuation uses the electrostatic force generated between the electrode 22 (or 22') and the nanowire(s) by applying a potential difference.

Thermoelastic actuation can be used when the two layers (metallic and insulating) are of same length, equal to the length of the nanowire. This type of actuation uses the heating effect in each of the layers. Since the layers are of different types, expansions are different, which generates a flexural moment and hence motion of the nanowire.

Figure 16:
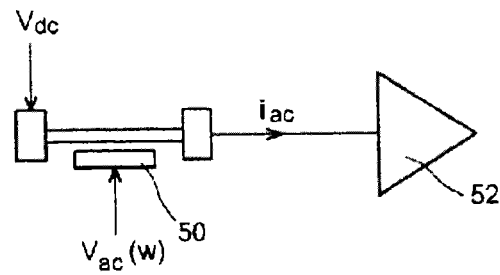
FIGS. 16-18 show means to measure the variation in resistance in a nanowire according to the invention.

A device according to the invention can use means to read the variation in resistance of the nanowire(s). Examples of such means are given in FIGS. 16-18.

The variation in resistance at the terminals of the nanowire(s) can be measured directly via modulation of the current I passing through them at constant reading voltage. This is the case for example in the schematic given in FIG. 16: a constant voltage $V_{dc}$ is applied to the terminals of the nanowire. Reference 50 symbolizes an excitation electrode to which an alternating voltage $V_{ac}$ is applied. The output signal, a current $i_{ac}$, is connected to an amplifier 52.

Figure 17:
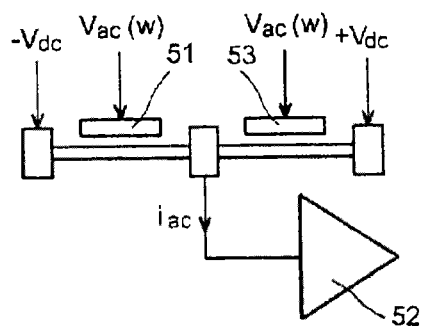

The schematic in FIG. 17 shows direct measurement with a half-bridge. The nanowire is under constant voltage $V_{dc}$. The electrodes 51 and 53 allow an alternating voltage of frequency ω to be applied to one of the parts of the wires. The emerging alternating current $i_{ac}$, taken between the two parts of the bridge, is sent to an amplifier 52.

Figure 18:
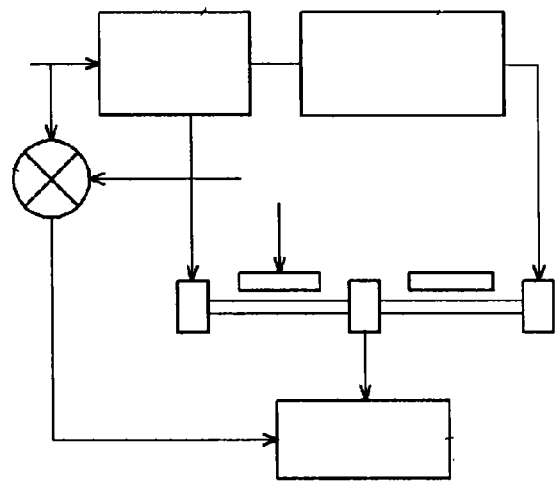

A heterodyning technique, schematically shown in FIG. 18, can be used to bring resistance measurement from high frequencies to low frequencies. This technique can be used both for direct measurement and for differential measurement using a bridge. For this technique reference can be made to I. Bargatin et al "Applied Physics Letters", vol. 86, 133109 (2005).

In these assemblies, the alternating voltages can be generated via local oscillators. The reading system can be integrated (structured on the same chip) or placed on an external ASIC (application specific integrated circuit).

In a device according to the invention, transduction (creation of a current by motion of the nanowire) occurs through the nanowire, this wire therefore being used both as proof mass (mobile part) and as gauge element to obtain the desired piezoresistive conversion.

It is shown that the relative variation in resistance of the nanowire then becomes proportional to amplitude of motion; by reproducing the denotations of equation (1):

$$\frac{dR}{R} = G\varepsilon_L \approx \frac{G\pi t_1}{2z}\sin\left(\frac{2\pi z}{L}\right)\left(\frac{a}{L}\right) \quad (2)$$

A device according to the invention therefore makes it possible to know the variation in resistance ΔR, related to the variation in stress (σ) induced by vibration of the nanowire, since ΔR is proportional to stress.

Generally, a resistance formed by a structure in the form of a nanowire having both conductive properties and elastic properties, varies as a function of axial strain as follows:

$$\frac{dR}{R} = \frac{d\rho}{\rho} + \frac{dL}{L} + \frac{dS}{S} = \frac{d\rho}{\rho} + \varepsilon_L(1+2\nu) \quad (3)$$

in which ρ is the resistivity of the medium consisting of the rod, $\varepsilon_L$ is the relative elongation of the rod of which S and L are respectively the length and the cross-section. υ is Poisson's ratio.

The first term (dρ/ρ) corresponds to the piezoresistive effect properly so called, whereas the second ($\varepsilon_L$ (1+2ν)) corresponds to a purely geometric effect.

With regard to a semiconductor such as silicon, the second term is smaller than the first by several orders of magnitude.

Piezoresistivity is a physical phenomenon which relates a relative variation in resistivity $$\frac{d\rho}{\rho}$$

with a stress applied to a piezoresistive material, which here is a nanowire. This relationship can be expressed as:

$$\frac{d\rho}{\rho} = \Pi_L \sigma_L + \Pi_T \sigma_T, \quad (2)$$

in which:

$$\Pi_L = \Pi_{11} - 2(\Pi_{11} - \Pi_{12} - \Pi_{44})(l_1^2 \cdot m_1^2 + l_1^2 \cdot n_1^2 + m_1^2 \cdot n_1^2)$$

$$\Pi_T = \Pi_{12} + (\Pi_{11} - \Pi_{12} - \Pi_{44})(l_1^2 \cdot l_2^2 + m_1^2 \cdot m_2^2 + n_1^2 \cdot n_2^2)$$

Figure 19:
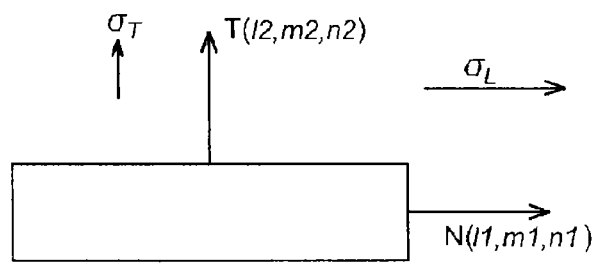
FIG. 19 is a schematic of a piezoresistive gauge with the associated main axes N, T.

$\Pi_{ij}$ are the tensor elements of piezoresistivity expressed along the main crystalline axes of the semiconductor. $\Pi_L$ and $\Pi_T$ are respectively the longitudinal piezoresistive coefficient and the transverse piezoresistive coefficient expressed at a main reference system (N, T) of the nanowire (see FIG. 19), N lying in the direction of the nanowire, T lying in a transverse direction. $\sigma_L$ and $\sigma_T$ are respectively the longitudinal and transverse stresses applied, as illustrated in FIG. 19.

For a nanowire oriented along axis <110>, the variation in resistance is reduced to:

$$\frac{dR}{R} = \frac{d\rho}{\rho} = \frac{\Pi_{44}}{2} \sigma_L \quad (3)$$

Let us assume first the case of a homogeneous nanowire. This case can be treated as a beam of circular section. This wire is subjected to a stress, due to its changeover to a position, illustrated in FIG. 20, in which part of the wire is brought away from the position it occupies at rest (i.e. when no external stress is applied). The longitudinal stresses (axial) induced by this bending are easily expressed in relation to the flexural moment:

$$\sigma_L = \frac{My}{I} \quad (4)$$

Figure 20:
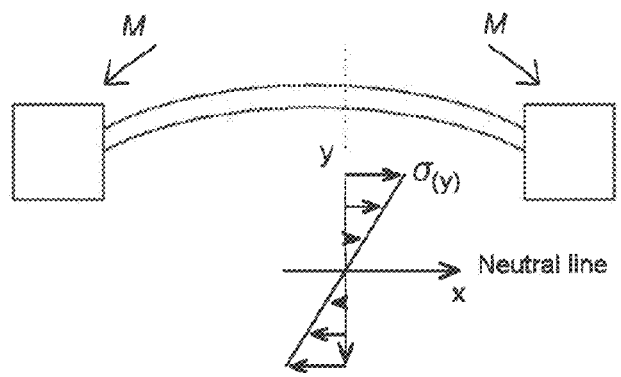
FIG. 20 is a schematic showing a flexural moment and an axial strain induced in one section of a nanowire.

I is the quadratic moment, M is the flexural moment shown in FIG. 20, y is the ordinate, taking as origin the neutral fibre along which stresses are zero (dotted line in FIG. 20).

The mean stress on the section of nanowire is zero.

Figure 21A:
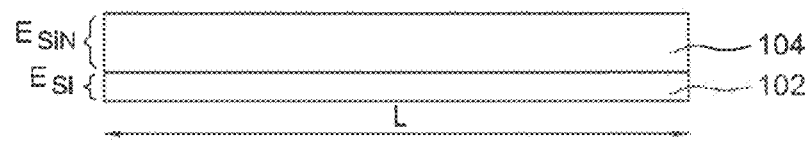
FIGS. 21A-21C show a nanowire according to the invention, and calculation of the position of neutral fibre c from the positions of the neutral fibres of the sections of each layer.

Let us now consider the case of a non-homogeneous nanowire, as illustrated in FIG. 21A, of rectangular cross-section consisting of one part 102 in weakly doped silicon of thickness $t_2$ (e.g. doping of about $10^{15}$ cm$^{-3}$ to $10^{19}$ cm$^{-3}$) and one piezoresistive nitrided part 104 SiN of thickness $t_1$.

The nitrided part 104 here has a thickness $t_1$ that is greater than part 102 in silicon (thickness $t_2$) so as to concentrate the stress. In limit cases, the thickness of the Si layer becomes negligible compared with that of SiN, and the stress in Si is then maximal and equal to the stress calculated on the external fibre of the SiN layer. In a more general case ($t_2$ non-negligible compared with $t_1$), the position of the neutral fibre is determined. This depends not only on the thicknesses but also on the respective Young modulus values ($E_{Si}$=160 GPa along <110> and $E_{SiN}$=230 GPa).

Figure 21B:
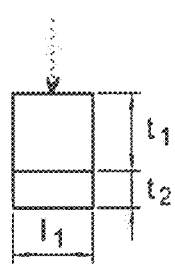
Figure 21C:
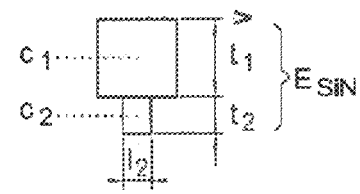

FIGS. 21B and 21C explain how to calculate the position of this neutral fibre giving consideration to the transformed section principle. Then, knowing the position of this neutral fibre and using equation (4) it is possible to deduce the mean stress in Si.

The transformed section is defined by:

$$l_2 = l_1 E_{Si}/E_{SiN}$$

and $$C = (c_1(t_1 l_1) + c_2(t_2 l_2))/(t_1 l_1) + (t_2 l_2)$$

in which $c_1 = t_1/2$ and $c_2 = t_2/2$.

The quadratic moment of the equivalent structure is given by the following expression:

$$I = I_1 + I_2 + (t_1 l_1)\left(\frac{t_1}{2} - c\right)^2 + (t_2 l_2)\left(t_1 + \frac{t_2}{2} - c\right)^2 \text{ with } I_{1,2} = \frac{t_{1,2}^3 l_{1,2}}{12} \quad (5)$$

Finally the mean stress in a section along x (longitudinal coordinate) of Si is:

$$\overline{\sigma}_L(x) = \frac{M(x)}{2I}(t_1 + t_2 - 2c) \quad (6)$$

When the thickness of the silicon is negligible compared with that of SiN (favourable case) the stress in Si, as first approximation, is the stress applied to the outermost fibre of SiN, when considering that the neutral fibre is given by $c_1$:

$$\sigma_L(x) = \frac{M(x)t_1}{2I} \text{ with } I \equiv I_1 \quad (7)$$

To obtain the mean stress along that part of Si forming the wire, (6) or (7) must be integrated over the length of the wire giving consideration to strain.

Knowing that:

$$EI \frac{\partial^2 y(x)}{\partial x^2} = M(x) \quad (8)$$

Considering a gauge of dimension z, the expression (7) is reduced to:

$$\sigma_L(x) = \frac{Et_1}{2} \int_0^z \frac{\partial^2 y(x)}{\partial x^2} dx \quad (9)$$

Finally, the variation in resistance is expressed as follows:

$$\frac{dR}{R} = \frac{d\rho}{\rho} = \frac{\Pi_{44}}{2} \frac{Et_1}{2} \int_0^z \frac{\partial^2 y(x)}{\partial x^2} dx = G \frac{t_1}{2} \int_0^z \frac{\partial^2 y(x)}{\partial x^2} dx = G\varepsilon_L$$

$\in_L$ is the elongation of the gauge, G is the gauge factor (in the order of several thousand [e.g. for a boron-doped Si nanowire with $10^{15}$ cm$^{-3}$ doping]).

With respect to the second embodiment of the invention, direct use is made of the elongation of the structure. The origin of the variation is different but the calculation is identical:

$$\frac{dR}{R} \approx \varepsilon_L(1 + 2\nu) \approx G\varepsilon_L$$

G is of the order of one unit to a few units (typically 2 for metals).

It can be seen that, in both cases, the variation in resistivity is of order 1.

In a nanowire according to the invention, irrespective of the embodiment considered, the dissymmetry created owing to the different electric conductivities, allows different stresses to be generated above and below the neutral fibre. These stresses do not find equilibrium and this imbalance allows a first-order measurement to be obtained.

Methods to fabricate the devices of the invention will now be described.

One embodiment of wires having different materials over their thicknesses is described in document FR 2 884 648. This technique uses lithography and etching steps. Two examples of embodiment will be given with reference to FIGS. 22A-22L and 23A-23E, respectively for "piezoresistive" transduction with an insulating layer and for transduction using a metal.

First the sequence of steps in FIGS. 22A-22L will be described, which concerns the fabrication of a single nanowire but can easily be applied to the fabrication of a plurality of nanowires.

During a first step, a silicon wafer 200 is selected.

Two epitaxies (FIG. 22B) are then successively performed of a layer 202 in SiGe and of a layer 204 in Si. The proportion of germanium in the SiGe layer 202 can be set at a given value; it can also be variable in this layer, which induces a variation in the initial stress therein. This initial stress can therefore be adjusted by controlling the proportion of germanium.

Next (FIG. 22C) lithography and then etching of the silicon layer 204 are conducted to form a nanobeam 206, whose cross-sectional dimensions are in the order of 50 nm×50 nm for example.

In this embodiment an actuating electrode can be structured.

Figure 22A:
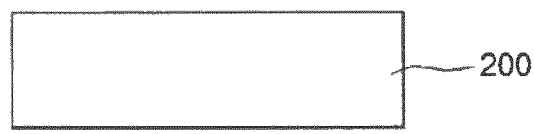
FIGS. 22A to 22L and 23A-23E are steps in the fabrication of different devices according to the invention.
Figure 22B:
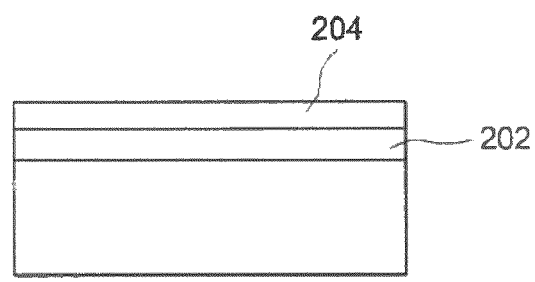
Figure 22C:
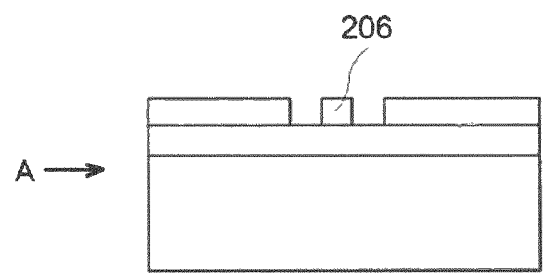
Figure 22D:
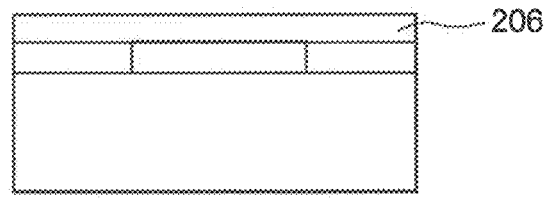
Figure 22E:
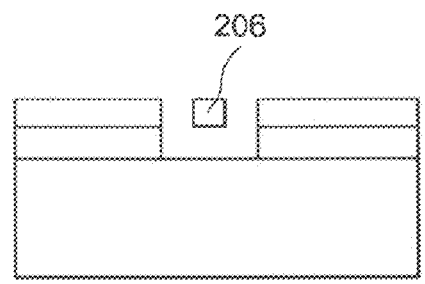
Figure 22F:
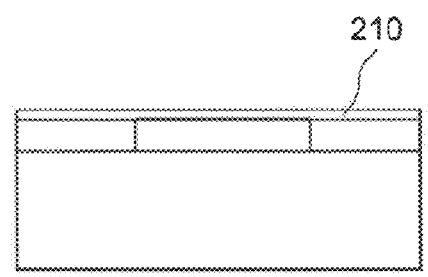
Figure 22G:
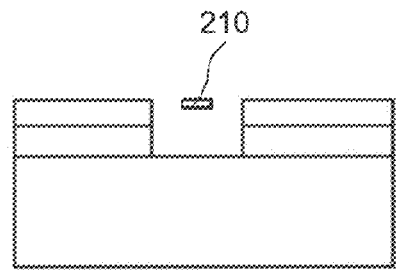
Figure 22H:
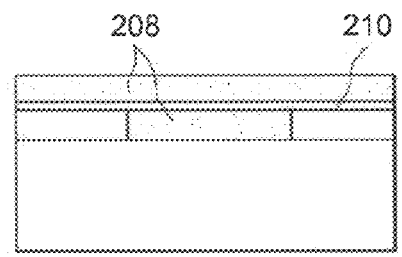

This nanobeam is then released by tunnel etching of the SiGe layer 202, of which two views are illustrated in FIGS. 22D and 22E. The view in FIG. 22E is a side view along arrow A of FIG. 22C.

The cross-section of the nanobeam is then reduced to form one or more nanowires 210 (FIGS. 22F and 22G, respectively from FIGS. 22D and 22E), until they reach a diameter or dimension in the order of 25 nm for example or more generally between 10 and 30 nm.

This is followed (FIG. 22H) by a deposit of oxide 208 which encompasses all the nanowire 210, and which notably fills the gap between the nanowire and the substrate but is also deposited above the nanowire.

The oxide deposit made over the nanowires can then be subjected to lithography and etching operations (FIG. 22I), to release access areas to the nanowire for the purpose of transforming some selected regions.

Nitriding 220 can then take place (FIG. 22J) of the released portions of nanowire, over a thickness of 10 nm for example, the technique used possibly being an annealing technique which does not induce any reaction in the oxide.

Next (FIG. 22K) the oxide 208 above the wire is removed; removal of SiN on the oxide can be obtained via wet process. Optionally it is possible to thicken the contact regions and to make them metallic by doping and/or siliciding and/or metallisation.

Figure 22I:
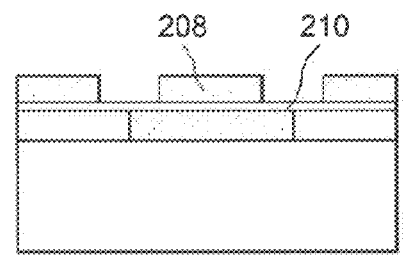
Figure 22J:
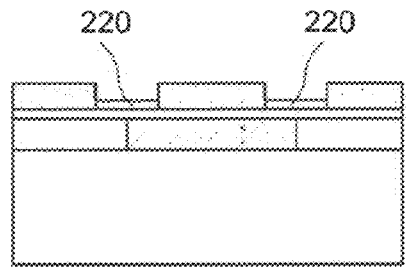
Figure 22K:
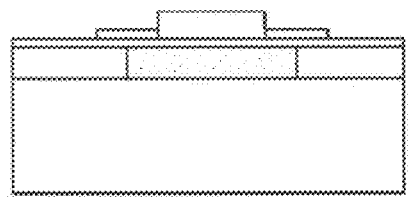
Figure 22L:
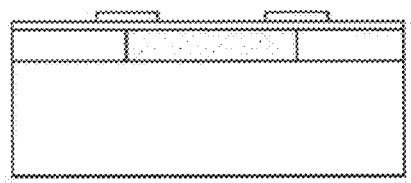

Finally, the nanowire is released by etching the oxide 208 arranged in the cavity in contact with the substrate (FIG. 22L).

The two first steps of this method can be omitted by using a SOI wafer. In this case, the oxide is etched instead of the SiGe layer. Release (FIG. 22D) is then obtained by vapour HF.

The sequence of steps in FIGS. 23A-23E will now be described which also concerns the fabrication of a single nanowire, but can easily be applied to the fabrication of a plurality of nanowires. It is recalled that the purpose here is to obtain "piezometallic" transduction.

The figures at the start of the method are identical to FIGS. 22A-22I described above. They have therefore not been reproduced. The description given above with reference to these figures remains valid.

Figure 23A:
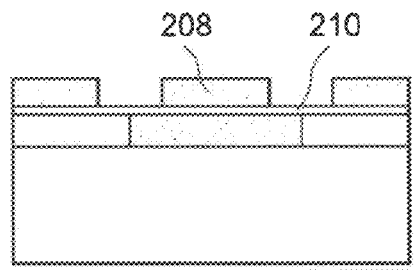

The starting material is therefore a structure such as the one shown in FIG. 22I, reproduced in FIG. 23A.

Figure 23B:
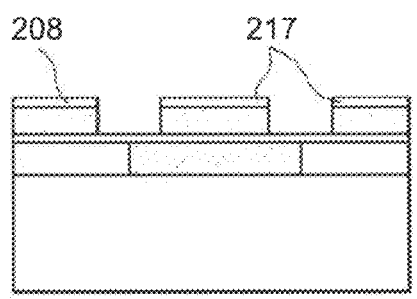
Figure 23C:
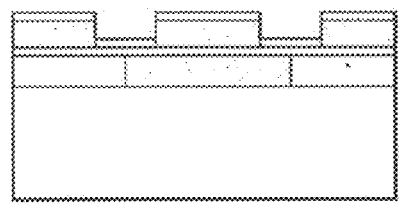
Figure 23D:
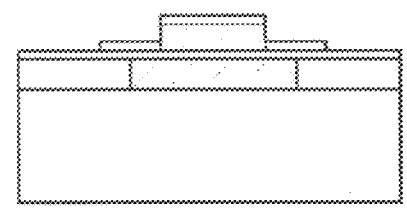

A metal deposit 217 (nickel or platinum) is made over all the regions (FIG. 23B).

It is then possible (FIG. 23C) to proceed with siliciding by diffusing the metal of the released portions of nanowire over a thickness of 6 nm for example. The technique used is an annealing technique which does not induce any reaction in the oxide. The siliciding process can be replaced by doping (until amorphisation).

Figure 23E:
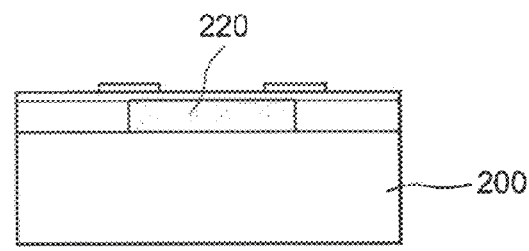

Next (FIG. 23D) the oxide 208 is removed above the nanowire; removal of NiSi on the oxide can be obtained via wet process. Finally, the nanowire is released by etching the oxide arranged in the cavity 220 in contact with the substrate 200 (FIG. 23E).

Here again, the two first steps can be omitted by using a SOI wafer. Release is then achieved also using vapour HF.

Another example of embodiment of a method to obtain a device according to the invention is given with reference to FIGS. 24A-24E.

Figure 24A:
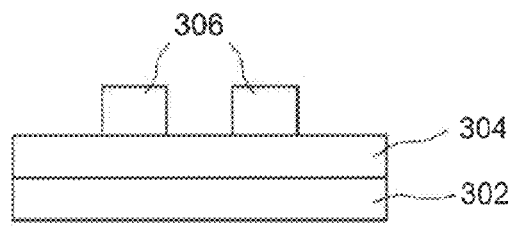
FIGS. 24A to 24E are other steps in the fabrication of a device according to the invention.
Figure 24B:
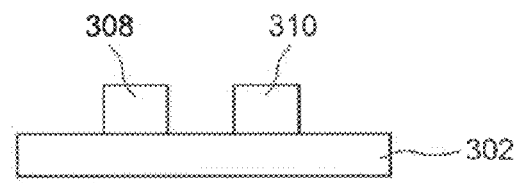
Figure 24C:
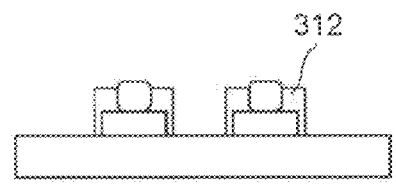

In an initial step, a bi-layer consisting of a layer 302 of SiO$_2$ or SiGe or Si and a layer 304 of SiGe or Si is formed (FIG. 24A). A layer of resin can be formed above this bi-layer then etched to form patterns 306 therein which will allow etching of layer 302 (FIG. 24B).

Annealing can optionally be performed to round off the tops of the pads 308, 310 in Si thus formed. As a variant, a succession of annealing and/or oxidation steps can be performed to round off and reduce the cross-section of the nanowire. One or more annealing and/or oxidation steps permit rounding-off of the nanowires, hence a reduction in the cross-section of these nanowires to a diameter of about 5 nm for example. Recrystallization can be obtained by annealing.

A mask (spacer) 312 in SiO$_2$ or SiN or bilayer is then deposited and etched.

Figure 24D:
Figure 24E:
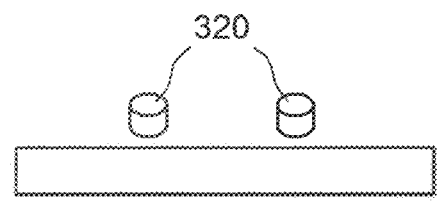

Siliciding 320 is then carried out as described previously followed by selective removal respectively of nickel, platinum, cobalt, . . . (FIG. 24D). The parts not protected by the spacer 312 are silicided.

Finally (FIG. 24E) etching is carried out with pure HF for SiO₂, and CF4 plasma with oxygen for SiGe. This releases nanowires 320 having the structure according to the present invention.

In a device according to the invention, the measurement means can consist of an external circuit.

Actuation e.g. electrostatic is achieved via a gap between the substrate and the nanowire after release of the nanowire. It is preferably achieved by etching a "lateral" gap between the nanowire and an electrode during the etching step to define the nanowire.

According to one variant of embodiment, the nanowire can be set in vibration through the use of actuation means comprising a lateral electrode and an electrode underneath the nanowire.

A sensor according to the invention can be used as chemical sensor (said application with another sensor is described in Y. Wims et al. "Sensors and Actuators" B 108 (2005)), in gas phase or liquid phase, or it can be used as molecular force sensor (said application with another sensor is described in J. L. Arlett et al. "Nobel Symposium", 131 (2006)), or in the area of mass spectrometry (said application with another sensor is described in W. Jensen et al. "Nature Nanotechnology" 9, 533 (2008)).

With the invention it is therefore notably possible to obtain a nanowire sensor having at least two highly different conductivity parts or regions, using at least two approaches:

either a metal/semiconductor nanowire for example fabricated using a microelectronics technique to obtain the conductive layer, and with one or more of the above-described steps (by siliciding an undoped or scarcely doped part of the nanowire, or by doping part of the wire optionally until amorphisation);

or by nitriding at least part of a doped wire.

Additionally, one or more sensitive regions (such as the piezoresistive gauge[s]) can be localized, hence an improvement in transduction efficiency.

In all cases, it is possible to achieve improved contacting as a result of very low access resistance, in particular by doping contact regions.

With a device according to the invention a first-order effect is obtained in the semiconductor, and therefore an increased detection effect compared with known techniques, in particular as described in document WO 2005/106417.

The invention claimed is:

1. A device comprising:
at least one nanowire including a first conductive region, and a second region, the first conductive region and the second region being dissymmetrically disposed relative to a central axis of the at least one nanowire that extends along a longitudinal direction of the at least one nanowire,
wherein the second region is an insulator material,
the second region does not occupy an entire thickness in the at least one nanowire, and
the at least one nanowire is configured to allow circulation of current in the at least one nanowire from one end of the at least one nanowire to another end of the at least one nanowire.

2. The device according to claim 1, wherein for the at least one nanowire, the second region extends over a length that is shorter than a length of the at least one nanowire.

3. The device according to claim 1, wherein the first conductive region includes a doped semiconductor material or a metallic material.

4. The device according to claim 3, wherein the first conductive region includes the doped semiconductor material that is piezoresistive material.

5. The device according to claim 1, wherein the first conductive region includes doped semiconductor material, and the doped semiconductor material is doped with arsenic, boron or phosphorus.

6. The device according to claim 3, wherein the first conductive region includes a silicided metal.

7. The device according to of claim 1, wherein the insulator material includes a dielectric material or an intrinsic semiconductor material.

8. The device according to claim 1, wherein the insulator material includes an intrinsic semiconductor material, and the intrinsic semiconductor material includes silicon or an alloy of non-doped silicon and Germanium (SiGe).

9. The device according to claim 1, wherein the insulator material includes a dielectric material, and the dielectric material includes silicon nitride, aluminium nitride, or silicon oxide.

10. The device according to claim 1, wherein
a the second region includes a non-doped SiGe, and the first conductive region in doped Si, or
a dielectric region in non-doped Si and a conductive region includes a doped SiGe.

11. The device according to claim 1, further comprising:
at least one fixed anchor region at the one end of the at least one nanowire, the at least one fixed anchor region including an electric contact region.

12. The device according to claim 11, wherein the electric contact region and the first conductive region of the at least one nanowire includes a same conductive material.

13. The device according to claim 1, further comprising:
two fixed anchor regions, a first of the two fixed anchor regions being attached to the one end of the at least one nanowire and a second of the two fixed anchor regions being attached to the another end of the at least one nanowire.

14. The device according to claim 1, further comprising:
at least one mobile mass attached to the one end of the at least one nanowire.

15. The device according to claim 1, wherein the at least one nanowire is in plurality, and the device further includes:
a substrate that indirectly supports the plurality of nanowires, and the plurality of nanowires are stacked perpendicularly to a plane of the substrate directly below and facing the plurality of nanowires.

16. The device according to claim 1, wherein the at least one nanowire is in plurality, and the device further comprising:
two support structures,
wherein the plurality of nanowires are suspended between the two support structures.

17. The device according to claim 1, wherein a resistance of the conductive region varies in relation to strain applied to the at least one nanowire.

18. The device according to claim 17, wherein a variation of the resistance of the conductive region is of order 1.

19. The device according to claim 1, wherein the central axis corresponds to a neutral fiber along which stresses are zero.

20. The device according to claim 1, wherein the at least one nanowire is suspended between two support regions.

21. The device according to claim 1, wherein the device is a sensor.

* * * * *